United States Patent [19]

Kawaguchi et al.

[11] Patent Number: 4,788,684
[45] Date of Patent: Nov. 29, 1988

[54] MEMORY TEST APPARATUS

[75] Inventors: Ikuo Kawaguchi; Yoshihiko Hayashi, both of Yokohama, Japan

[73] Assignee: Hitachi, Ltd., Tokyo, Japan

[21] Appl. No.: 895,846

[22] Filed: Aug. 12, 1986

[30] Foreign Application Priority Data

Sep. 9, 1985 [JP] Japan .................................. 60-197839
Sep. 9, 1985 [JP] Japan .................................. 60-197840

[51] Int. Cl.⁴ ............................................ G06F 11/26
[52] U.S. Cl. ......................................... 371/21; 371/27; 371/25
[58] Field of Search ...................... 371/21, 25, 27, 38; 324/73 R, 73 AT; 365/201; 364/200 MS File, 900 MS File

[56] References Cited

U.S. PATENT DOCUMENTS

| | | | |
|---|---|---|---|
| 4,380,068 | 12/1983 | de Cauasnon | 371/21 |
| 4,414,665 | 11/1983 | Kimura | 365/201 |
| 4,495,603 | 1/1985 | Varshney | 365/201 |
| 4,627,053 | 12/1986 | Yamaki | 371/21 |

Primary Examiner—Jerry Smith
Assistant Examiner—Robert W. Beausoliel
Attorney, Agent, or Firm—Antonelli, Terry & Wands

[57] ABSTRACT

A memory test apparatus for testing a high-performance memory having two or more memory functions, including a pattern generator for generating an algorithmic pattern to be inputted to a first memory block of a memory under test having at least two memory blocks, an auxiliary pattern generator for storing an output from the algorithmic pattern generator and for outputting an expected value to a second memory block of the memory under test at a preset timing based on the stored output, a comparator for comparing outputs from the first and second memory blocks with expected values for the memory blocks, and a memory for storing an output from the comparator. Since the algorithmic pattern generator and the auxiliary pattern generator are included, the test apparatus has such an affect that even if the first and second memory blocks of the memory under test operate asynchronously, the data transfer function therebetween and the performance related to the operation timing can be tested, thus providing a highly precise memory test apparatus.

15 Claims, 8 Drawing Sheets

MEMORY TEST APPARATUS

BACKGROUND OF THE INVENTION

The present invention relates to a memory test apparatus, and in particular, to a memory test apparatus stuitable to test a high-performance memory having at least two memory functions.

Large-scale integration (LSI) memory devices have been developed in various fashions, for example, the memory capacity has been increased to 256K bits or 1M bits, the nibble mode has been introduced for a higher-speed operation, and a two-port configuration has been implemented in a video random access memory (RAM) for an improved performance.

Marching and galloping patterns are well known as test patterns for a semiconductor memory. These patterns are generated by use of an algorithmic pattern generator. As shown in FIG. 3, as a memory IC begins to have higher performance, two kinds of memory functions are contained in the same chip. A memory unit B configured with a shift register is called a video RAM, which is used to process images. While a great amount of image data is read or written by use of an address 6 of a memory unit A and input/output data 7 and 10, display data to a cathode-ray tube (CRT) is transferred from the memory unit A via a signal line 4 so as to be read at a high speed synchronized with the display speed of the CRT. During a read operation on the memory unit B, data access is independently achieved on the memory unit A. Such memory functions require a memory tester to effect an independent test for the memory units A and B, and to have a capability of checking the data transfer function therebetween. That is, when data algorithmically written in the memory unit A is read in column or row units and is transferred to the memory unit (shift register) B so as to sequentially read the data through an output data line 11, the relationships between the preceding and succeeding data thus read are no longer algorithmic; consequently known prior art testers cannot generate the data expected for checking the memory. Moreover, the operation speeds of the large-capacity, low-speed memory unit A and that of the small-capacity, high-speed memory unit (register) B are different from each other. In addition, these memory units A and B must be synchronized only when data is transferred therebetween.

An apparatus of this kind has been described in "Testing a 317K Bit High Speed Video Memory with a VSLI Test System" (1984 ITC.P., pp. 294-299). In this example, however, a CCD memory is an objective item, and hence the system is not directly related to the present invention. Although a method for testing a video memory has been described, the configuration of the system has not been discussed.

In another example of an LSI memory test apparatus described in "Optimizing the Timing Architechture of a Digital LSI Test System", 1983 IEEE Int. Test Conf. paper 8.5, pp. 200-209, an external synchronization function is added to a timing signal generator to test an LSI having an integrated oscillation circuit or a minor cycle is further included in an operation cycle (test cycle) of the test apparatus to test an LSI having a clock demultiplier therein, namely, a minor cycle test cycle generator is provided in a timing generator to increase the test efficiency.

In these conventionl apparatuses, however, test provisions have not been considered with respect to such LSI's as a dual port memory of a multiprocessor or an image memory in which a plurality of data items are communicated in an asynchronous fashion, and hence these memory units cannot be tested in an actual operating state.

In addition, a video memory has been described in "320 Rows×700 Columns Image Dedicated Serial Input/Output Dynamic Memory for TV or VTR Field Memory" (Nikkei Electronics, Feb. 11, 1985); however, the configuration of the host system has not been discussed.

SUMMARY OF THE INVENTION

It is therefore an object of the present invention to provide a memory test apparatus capable of testing a high-performance memory such as a video RAM.

To achieve the object, according to the present invention, there is provided a memory test apparatus comprising means for generating an algorithmic pattern to be inputted to a first block (for example, the memory unit A of FIG. 3) of a memory to be tested a, auxiliary pattern generator for storing an output from said algorithmic pattern generator and for outputting an expected value to a second block (for example, the memory unit B of FIG. 3) of the memory under test at a preset timing based on the stored output data, means for comparing the outputs and the expected values of the first and second blocks, respectively of the memory, and a memory for storing an output from said comparing means. Furthermore, the test apparatus of the present invention is further characterized by including a timing generator for generating a timing cycle corresponding to the algorithm and auxiliary pattern generator.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Figure 1:
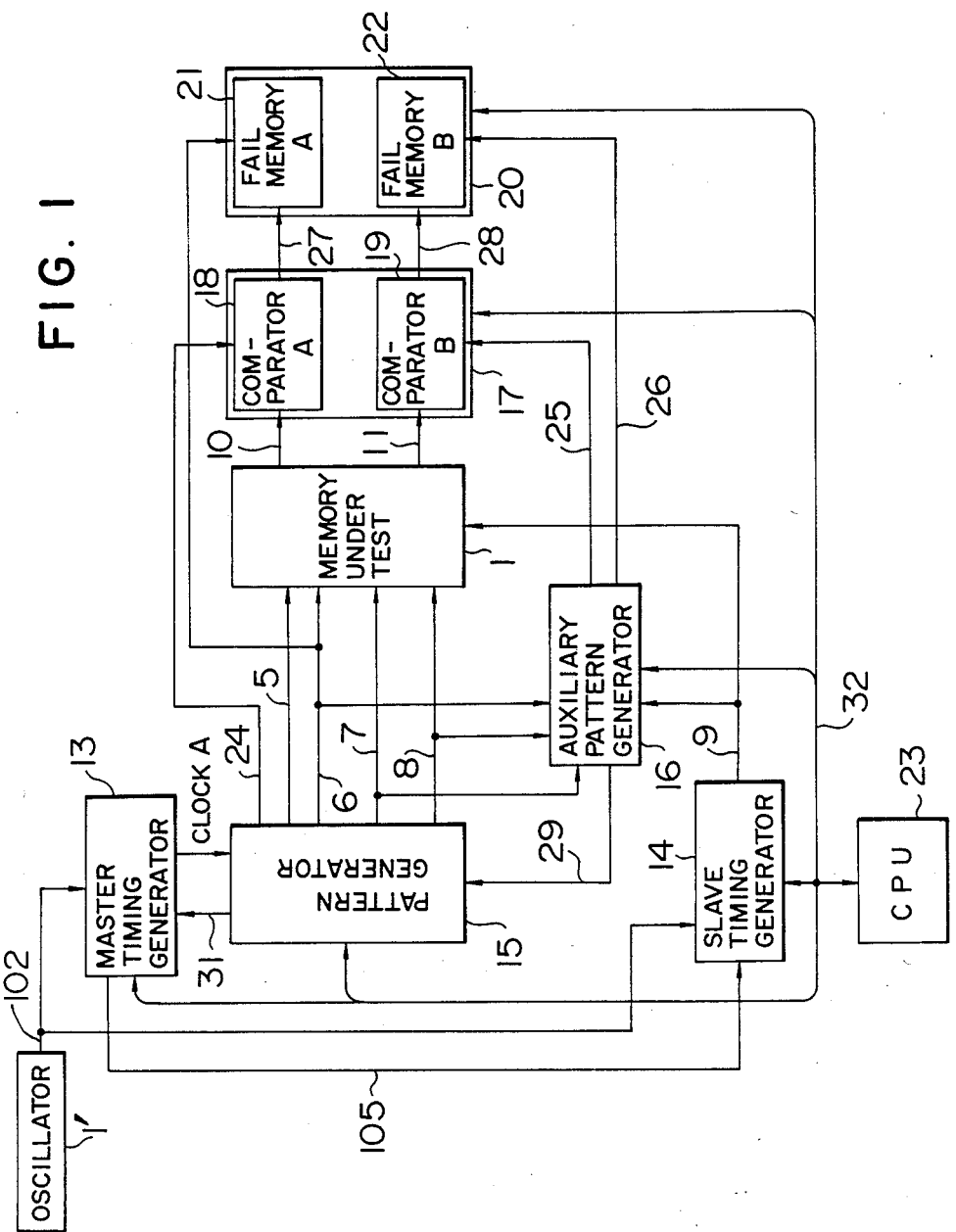
FIG. 1 is a schematic block diagram illustrating the basic configuration of the memory test apparatus according to the present invention.

Referring to FIG. 1, an embodiment of the present invention will be described.

FIG. 1 is a schematic block diagram showing the basic configuration of the present invention. In the following description, a memory under test 1 is assumed to include a memory unit B having a video RAM function constituted from a shift register (for example, a plurality of store and logic functions and a data transfer function to be independently conducted, or to be conducted therebetween, are provided). In this embodiment, to control an auxiliary pattern generator 16 and a slave timing generator 14, a pattern generator 15 is so designed to receive a generation completion signal 29 notifying that a series of expected values have been completely generated by the auxiliary pattern generator 16. The operations of the respective sections will be described.

The pattern generator 15 is configured, according to the same idea applied to the prior art memory tester, i.e., to function like a master to control the overall operation of this apparatus configuration in the embodiment. According to a timing select signal 31, a clock A for testing a memory A in the memory under test (MUT) 1 is inputted from a master timing generator 13; thereafter as a test program is executed, the system determines an address 6, an input data 7, a control signal 5 for the memory A, an expected value (A) 24 to be compared with a data item read from the memory A, a control line 8 for controlling the entire MUT, and an operation timing of the shift register 3 memory B. The master timing generator 13 outputs a control signal 105 for initiating or terminating the operation described above.

When a data item is written in the memory unit A of the MUT 1 by the pattern generator 15 and the data is transferred from the memory unit A to the shift register 3 according to the control line 8, then the data is read from the shift register 3. At this read timing the auxiliary pattern generator 16 generates an expected value in synchronism with the read operation. This is naturally controlled by use of the control line 8 to the MUT 1, however, a control line dedicated to the control may also be used. Timing, for example, for the read speed is supplied from the slave timing generator 14. Since the shift register 3 of the MUT 1 is associated with the column or row of the memory unit A and the data is considered to be of a finite length, the completion of shift operation must be determined, which is accomplished by the auxiliary pattern generator 16. That is, the generation completion signal 29 is transmitted to the pattern generator 15 to indicate the completion of a series of shift operations. Consequently, until the generation completion signal 29 is received, the pattern generator 15 can concurrently conduct a test on the memory unit A of the MUT 1.

On the other hand, an output from a control line 9 used as an MUT shift clock is so designed to be automatically stopped by use of a clock counter contained in the slave timing generator 14. A comparator section 17 containing comparators (A) 18 and (B) 19 and a fail memory 20 including fail memory units (A) 21 and (B) 22 are respectively separated because the output from the MUT 1 or the video RAM is of two-port configuration having two output data lines 10 and 11. The comparator (A) 18 and the fail memory unit (A) 21 are the same as those used in the prior art memory tester corresponding to the memory unit A of the MUT 1, whereas the comparator (B) 19 and the fail memory unit (B) 22 are provided to compare the output data line 11 from the shift register 3 of the MUT 1. According to a fail memory address (B) 26 fed from the auxiliary pattern generator 16, a fail result 28 from the comparator (B) 17 is written in the fail memory unit (B) 22.

Various control operations such as for writing initial data in the control memory ready to control registers in the respective sections are effected by a CPU 23 via a CPU control line 32 connected to the respective sections.

Figure 2:
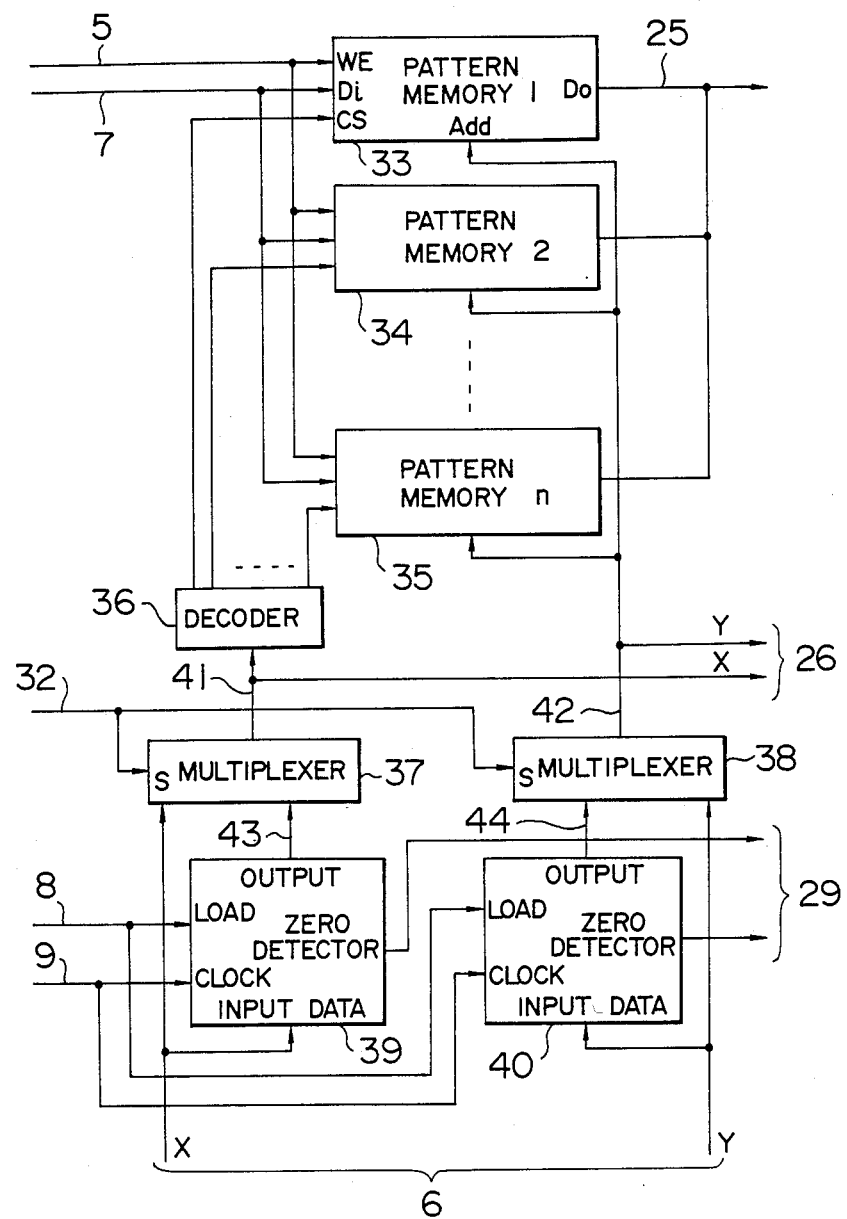
FIG. 2 is a block diagram illustrating the configuration of the auxiliary pattern generator according to the present invention.

FIG. 2 is a schematic block diagram illustrating an embodiment of the auxiliary pattern generator 16 of FIG. 1. Since the input/output lines have the same names and function as those of FIG. 1, an explanation will be omitted where duplicated. For the address, however, a two-dimensional MUT is usually applicable, and the outputs from the pattern generator 16 are represented as X and Y addresses.

Accordingly, the fail memory address (B) 26 and the generation completion signal 29 are also represented with X and Y components, respectively.

Figure 3:
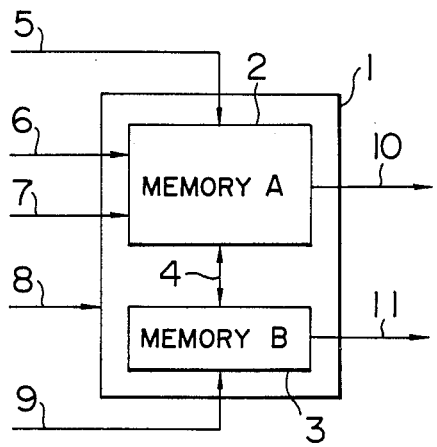
FIG. 3 is a schematic diagram illustrating the configuration of a high-performance memory as an example of the memory to be tested.

In the video RAM 1 or MUT of FIG. 3, data of the memory unit A 2 is subjected to a parallel transfer to the shift register in column or row units, and then the data is shifted and outputted in response to a shift clock input (the control line 9 of FIG. 1). The auxiliary pattern generator 16 has a memory configuration in which data is continually rewritten so as to be identical to the data of the memory unit A, so that the same data can be immediately outputted by a shift output operation.

The pattern memory units 1–n operate at a high speed to cope with the shift operation of the MUT 1. Each memory unit has a capacity corresponding to the Y address and the number (n) of these memory units is derived according to the X address 6. Preset down counters 39–40 enable the pattern memory to execute a pseudo shift operation only by use of a clock input when the MUT 1 performs a shift operation. The preset input data items to the counters 39–40 are X and Y addresses 6, respectively and are used to preset the start address for a shift operation. The setting of the start address is achieved by use of the control line 8 of the pattern generator (15 of FIG. 1), and thereafter a count-down operation is executed depending on the slave phase signal 9. Multiplexers 37–38 are provided to enable the X and Y addresses to be respectively selected because the memory unit B of the MUT 1 indicates the outputs from the counters 30–40 in the shift register configuration, as shown in this example, and an address must be directly specified in a case of a RAM. A decoder 36 decodes the X address 6, or the data from the preset down counter 39, to select one of the pattern memory units 1–n. An arbitrary address on the X or Y side is thus fixed by use of the configuration described above, thereby enabling a scan output operation with respect to the remaining side. The fail memory X and Y addresses (B) 26 are outputted from the multiplexers 37 and 38, respectively, and the X and Y components of the generation completion signal 29 are independently delivered. These signals are selected or combined as a control signal in the pattern generator 15 and the slave timing generator 14.

The control input to the multiplexer 37 is set by the CPU control 32 according to the internal configuration of the MUT prior to the start of the test.

On the other hand, if the read operation for the expected value B astrides address 0 of the X or Y address; a counter, a scan end address setting register, and a comprator for comparing the data items outputted from the counter and the register, respectively need only be provided in place of the preset down counter, thereby enabling the test apparatus to cope with such a condition. Although the hardware configuration is increased in size, this method can enhance the utilization of the present invention.

Although not described in conjunction with the present invention, if the memory unit B has an input function, the processing can be effected by connecting the expected value 25 of FIG. 2 to the pertinent input of the memory B.

According to the present embodiment, the following concrete advantages are obtained.
(1) All expected value data can be generated only by describing an algorithmic pattern program for the master pattern generator, which unnecessitates the creation of expected value data prior to a test and hence enables a highly flexible memory test free from restrictions of the hardware.
(2) Since the pattern memory has a capacity equivalent to the MUT capacity, the test apparatus has a high freedom also for a memory which will appear with a higher function in future.
(3) The scanning can be conducted along the column or row direction, or the combination thereof, which enables the apparatus to cope with a MUT having a higher function.

Next, a description will be given of an embodiment of the timing generating means unique to the present invention which is shown as the master timing generator 13 and the slave timing generator 14 in FIG. 1.

Figure 4:
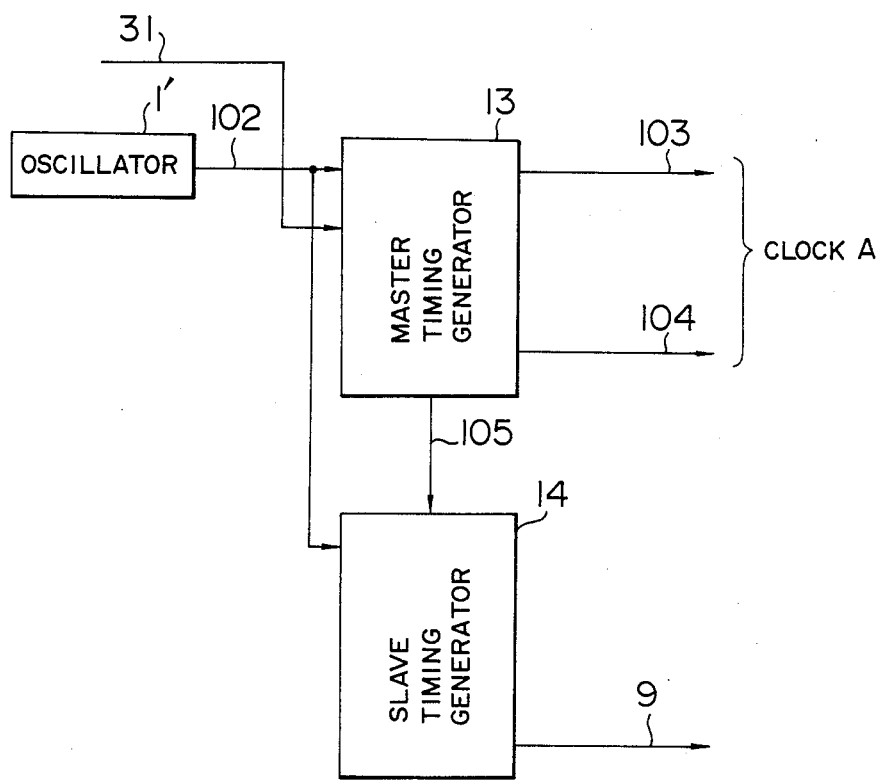
FIG. 4 is a block diagram depicting the configuration of the timing generator according to the present invention.

FIG. 4 is a block diagram illustrating an embodiment of the timing generating means according to the present invention in which an oscillator 1' outputs a basic clock 102 for generating timing signals 103–105. A master timing generator 13 generates the master test cycle signal 103, the master cycle signal 104, and the slave control signal 105 according to a timing select signal 31. A slave timing generator 14 is characteristic to the present invention and is activated by the slave control signal 105 to generate an arbitrary number of slave phase signals 9.

Figure 5:
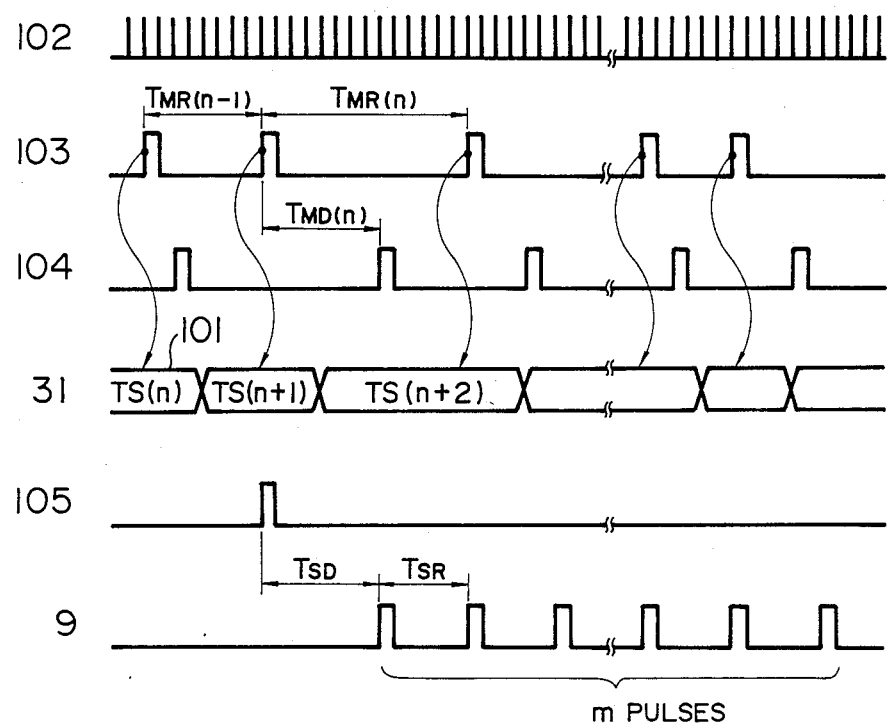
FIG. 5 is a timing chart depicting the operation of a timing generator according to the present invention.

Referring now to the timing chart of FIG. 5, the overall operation of the embodiment will be described. The master timing generator 13 receives the timing select signal 31 at a rising edge of the master test cycle signal 103. Assume here that the n-th timing select signal, TS(n) is to be received. Based on the received timing select signal TS(n), the master timing generator 13 counts the basic clock 102 to generate the master test cycle signal 103 delayed from TS(n) by one master test cycle and having a cycle of $T_{MR}(n)$ and the master cycle signal 104 delayed b $T_{MD}(n)$ from the start point of the master test cycle signal 103. Moreover, if the slave timing generator 14 is indicated to be started by the timing select signal 31, TS(n), a pulse at the start point of the master test cycle signal 103 having the cycle of $T_{MR}(n)$ is outputted as the slave control signal 105. The slave timing generator 14 is initiated by the slave control signal 105, and when a preset period of time is elapsed thereafter, a first pulse $T_{SD}$ of the slave phase signal 9 is outputted.

After the first pulse is delivered, m-1 pulses are outputted with the cycle of $T_{SR}$. That is, when initiated by the slave control signal 105, the slave timing generator 14 outputs m slave cycle signals 9 with the cycle of $T_{SR}$.

Figure 6:
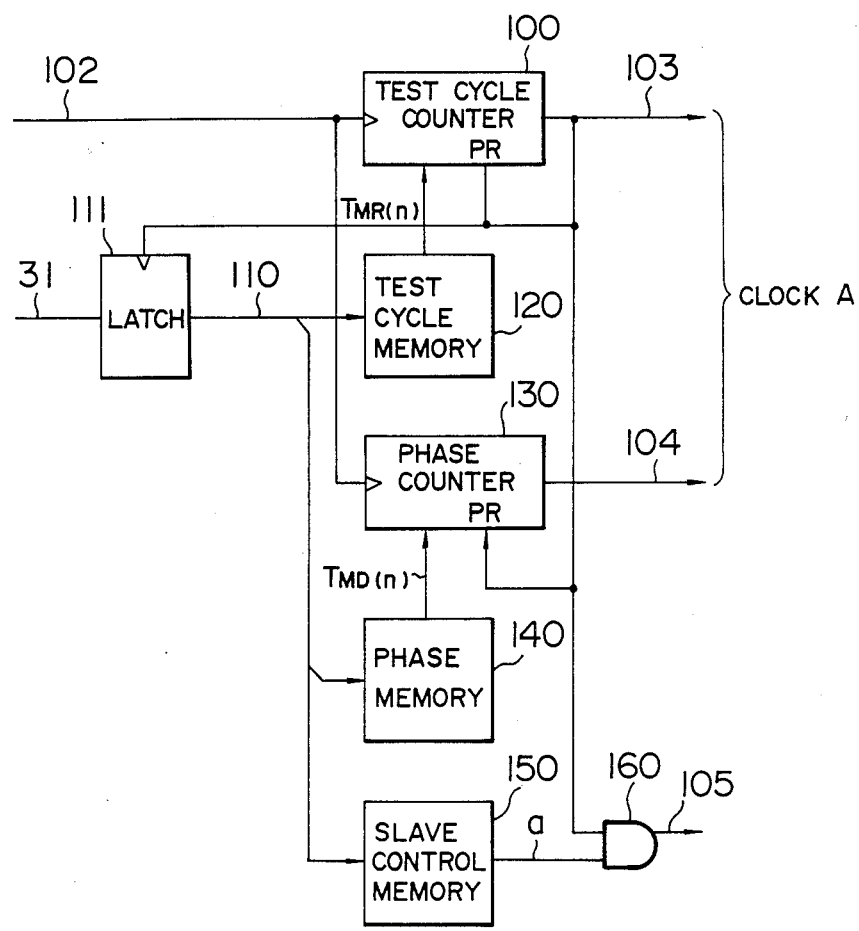
FIG. 6 is a schematic block diagram showing a configuration of the master timing generator section according to the present invention.

Next, the respective components will be described in detail. FIG. 6 is a schematic diagram illustrating an embodiment of the master timing generator 13 which includes a test cycle counter 100 for generating the master test cycle signal 103, a latch 111 for keeping the timing select signal 31, a test cycle memory 120 storing the setting value of the master test cycle signal 103, a phase counter 130 for generating the master phase signal 104, a phase memory 140 for storing the setting value of the master phase signal 104 to be set to the phase counter 130, and a slave control memory 150 storing information to control whether or not the slave control signal 105 is to be generated. In this embodiment, when the test cycle counter 100 counts the basic clock 102 and generates a master test cycle signal 103, the timing select signal 31 is fetched into the latch 111 at the rising edge of the cycle signal 103. The latched timing select signal 110 is outputted as an address for accessing the test cycle memory 120, the phase memory 140, and the slave control memory 150, and the setting value $T_{MR}(n)$ of the master test cycle signal 103 delayed by one master test cycle, the setting value $T_{MD}(n)$ of the master phase signal 104, and the control data a of the slave control signal 105 are read. Among these data items, the setting value $T_{MR}(n)$ and $T_{MD}(n)$ are preset to the test cycle counter 100 and the phase counter 130, respectively by use of the master test cycle signal 103. Consequently, the test cycle counter 100 counts the basic clock 102 according to the setting value $T_{MR}(n)$ and then outputs the master test cycle signal 103. Similarly, the phase counter 130 also counts the basic clock 102 according to the setting value $T_{MD}(n)$ and then outputs the master phase cycle signal 104. On the other hand, the control data a is set to the slave control memory 150 in advance so that if the inputted select signal 31 indicates to output the slave phase signal 9, the control data a becomes to be 1; otherwise, the control data a becomes to be 0. As a consequence, when outputting the slave phase signal 9, the master test cycle signal 103 is outputted as a salve control signal 105 via an AND gate 160. The operation described above is repeatedly effected by the master timing generator 13, which thereby generates the master test cycle signal 103, the master phase signal 104, and the slave control signal 105 according to the indication of the timing select signal 31.

Figure 7:
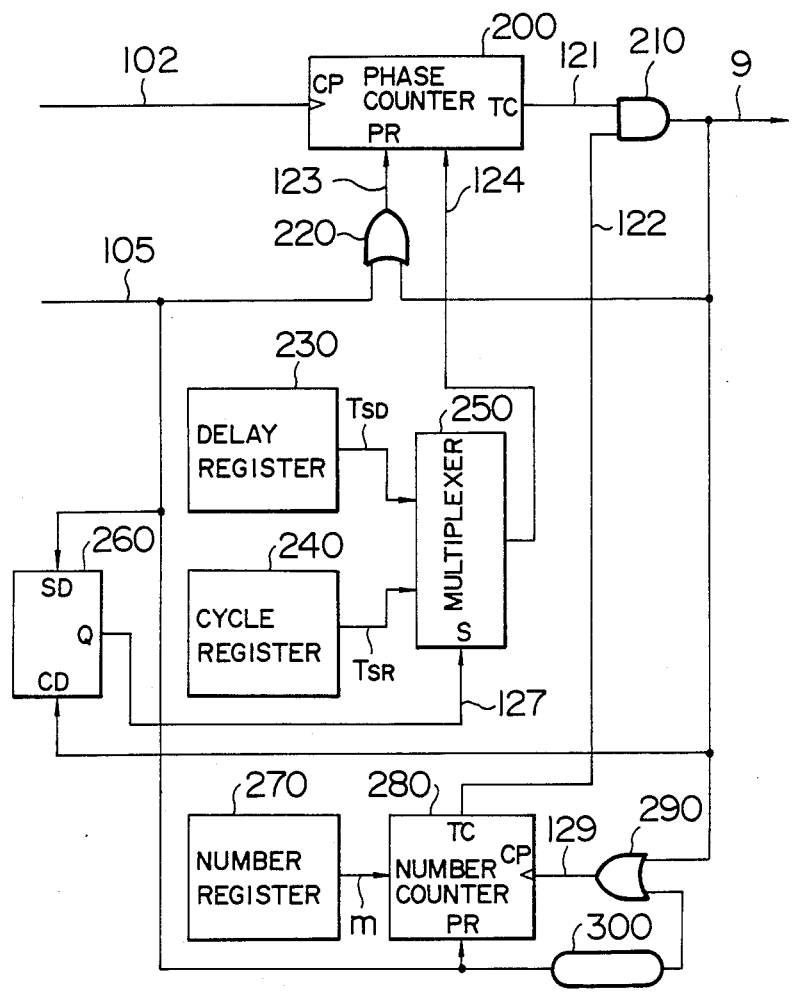
FIG. 7 is a schematic block diagram showing the configuration of the slave timing generator section according to the present invention.

FIG. 7 is a schematic block diagram illustrating an embodiment of the slave timing generator 14 comprising a phase counter 200 for generating the slave phase signal 9, an AND gate 210, an OR gate 220, a delay register 230 for storing a delay time $T_{SD}$ indicating a delay from the slave control signal 105 to the first pulse of the slave phase signal 9, a cycle register 240 for storing the cycle setting value $T_{SR}$ after the first pulse of the slave phase signal 9, a multiplexer 250 for selecting the delay $T_{SD}$ or the cycle setting value $T_{SR}$ and for outputting the selected data to the phase counter 200, a number register 270 for storing the number of slave phase signals 9, a number counter 280 for controlling the number of the generated slave phase signals 9, a flip-flop 260 for controlling the multiplexer 250, an OR gate 290, and a delay element 300. In this configuration, the slave timing generator 14 is activated by the slave control signal 105. That is, when the slave control signal 105 is inputted, the flip-flop 260 is set and the multiplexer 250 outputs the dela $T_{SD}$ stored in the delay register 230 to the phase counter 200. The delay $T_{SD}$ is supplied via the OR gate 220 to a PR terminal of the phase counter 200 so as to be preset thereto. The phase counter 200 continues counting the basic clock until the counted value reaches the preset value. When the counting is completed, the first pulse of the slave phase signal 9 is outputted via the AND gate 210. Concurrently, when the slave control signal 105 is inputted to the PR terminal of the number counter 280, the number of slave phase signals, m is preset to the number counter 280. Thereafter, the slave phase signal 9 is counted up to the number m, and then the AND gate 210 is closed to control the number of the generated slave phase signals 9. On the other hand, the flip-flop 260 is reset by the first output pulse of the slave phase signal 9 and the multiplexer 250 outputs the content $T_{SR}$ of the cycle register 240 to the phase counter 200. At the same time, the first output pulse is applied via the OR gate 220 to the PR terminal of the phase counter 200 and the content $T_{SR}$ of the cycle register 240 is preset to the phase counter 200. The phase counter 200 counts the basic clock 102 up to the preset value $T_{SR}$, and when the counting is finished, the second output pulse of the slave phase signal 9 is outputted. The third and subsequent output pulses are generated in the same fashion until the AND gate 210 is closed.

Figure 8:
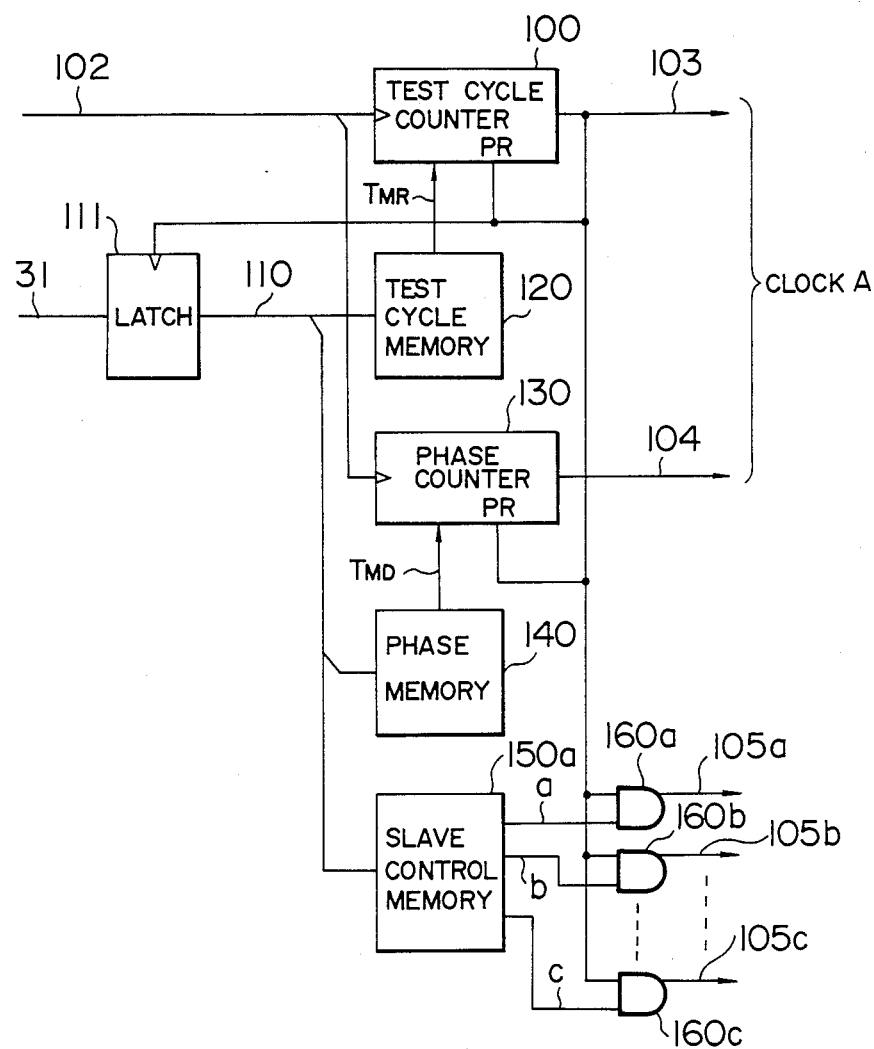
FIG. 8 is a schematic block diagram showing another configuration of the master timing generator section according to the present invention.
Figure 9:
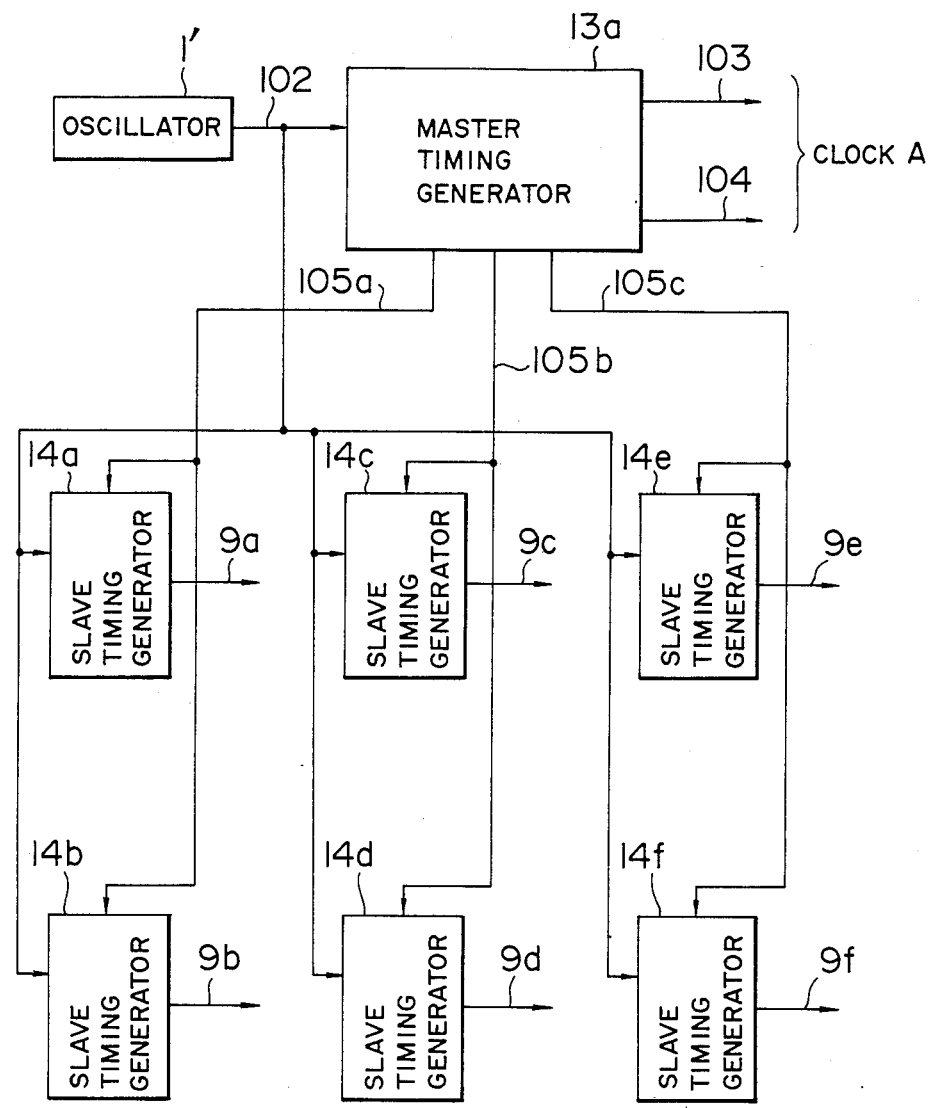
FIG. 9 is a schematic block diagram illustrating another configuration of the timing generator according to the present invention.

According to the embodiment as described above, a timing signal having a cycle different from the master test cycle can be generated beginning from a certain point of the master test cycle, which facilitates the test of devices with a dual port memory. This system, however, cannot cope with a case where a plurality of slave timing signals are necessary. For example, if a memory including two or more memory units B as shown in the high-performance memory of FIG. 3 is to be tested, the number of auxiliary pattern generators required for the test must be identical to that of the memory units B, namely, the slave phase signals are required to be outputted to the auxiliary pattern generating means, respectively. FIGS. 8-9 are schematic diagrams showing another embodiment which solves is problem. That is, a master timing generator 130 of this embodiment is configured as shown in FIG. 8. The capacity of a slave control memory 150a is increased and a plurality of AND gates are provided as compared with the master timing generator 13 of FIG. 6. Assume, that the slave memory 150a stores information indicated to activate one of the slave timing generators 14a-14f. When the content is read by use of the select signal 31, one of the slave control signals 105a-105c associated with the slave timing generator to be activated is turned on. In the configuration of FIG. 9, one of the slave timing generator 14a-14f (each configured as shown in FIG. 7) corresponding to the slave control signal thus turned on is activated, thereby obtaining the necessary number of test signals. It should be noted that the number of the slave control signals 105a-105c is here three and each slave control signal is assumed to activate two slave timing generators.

Although only one master phase signal 104 is obtained from the master timing generator 13 in the embodiments for simplification of description, a plurality of master phase signals are used in ordinary cases, which can be easily implemented without imposing any restriction on the present invention.

- As described hereabove, the memory test apparatus of the present invention has such an effect that memories having high functions can be tested.

We claim:

1. A memory test apparatus for testing a high performance memory of the type having first and second memory blocks, comprising:
   means for generating an algorithmic pattern to be inputted to a first block of a memory under test;
   auxiliary pattern generating means for storing an output from said algorithmic pattern generating means and for outputting an expected value for a second block of the memory under test at a preset timing based on the stored output;
   means for comparing outputs from said first and second blocks of the memory under test with expected values for said first and second blocks, respectively; and
   memory means for storing an output from said comparing means.

2. A memory test apparatus according to claim 1, wherein said auxiliary pattern generating means contains a content equal to a content of said first block of the memory under test and outputs as an expected value a pattern identical to a pattern transferred from said first block to said second block.

3. A memory test apparatus according to claim 1, wherein said second block of the test memory is a shift register.

4. A memory test apparatus according to claim 1, wherein said auxiliary pattern generating means receives an address signal and input data outputted from said algorithmic pattern generating means and includes a plurality of pattern memory units for storing the input data.

5. A memory test apparatus according to claim 4, wherein said address signal comprises an X address signal and a Y address signal.

6. A memory test apparatus according to claim 1, wherein said auxiliary pattern generating means receives an address signal and input data outputted from said algorithmic pattern generate means, outputs a fail memory address signal to a memory in which the output from said comparing means is stored, and outputs a generation completion signal indicating a completion of generation of a series of expected values for said second block to said algorithmic pattern generate means.

7. A memory test apparatus for testing a higher performance memory of the type having first and second memory block, comprising:
   means for generating an algorithmic pattern to be inputted to a first block of a memory under test;
   auxiliary pattern generating means for storing an output from said algorithmic pattern generating means and for outputting an expected value for a second block of the memory under test with expected values for said first and second blocks, respectively;
   means for comparing outputs from said first and second blocks of the memory with expected values for said first and second blocks, respectively;
   memory means for storing an output from said comparing means;
   master timing generating means for outputting a clock used to test said first block to said algorithmic pattern generating means; and slave phase signal to test said second block to said auxiliary pattern generating means;
   slave timing generate mean for outputting a slave phase signal to test said second block to said auxiliary pattern generate means.

8. A memory test apparatus according to claim 7, wherein said auxiliary pattern generating means contains a content equal to a content of said first block of the memory under test and outputs as an expected value a pattern identical to a pattern transferred from said first block to said second block.

9. A memory test apparatus according to claim 7, wherein said second block of the memory is a shift register.

10. A memory test apparatus according to claim 7, wherein said auxiliary pattern generating means receives an address signal and an input data outputted from said algorithmic pattern generating means and includes a plurality of pattern memory units for storing the input data.

11. A memory test apparatus according to claim 10, wherein said address signal comprises an X address signal and a Y address signal.

12. A memory test apparatus according to claim 7, wherein said auxiliary pattern generating means receives an address signal and an input data outputted from said algorithmic pattern generating means, outputs a fail memory address signal to a memory in which the output from said comparing means is stored, and outputs a generation completion signal indicating a completion of generation of a series of expected values for said second block to said algorithmic pattern generating means.

13. A memory test apparatus according to claim 7, wherein said master timing generating means comprises:
 a test cycle counter and a phase counter each for receiving a basic clock from an oscillator and
 a latch for receiving a timing select signal outputted from said algorithmic pattern generating means.

14. A memory test means according to claim 7, wherein said slave timing generating means comprises:
 a phase counter for receiving a basic clock from an oscillator and
 an OR gate and a flip-flop circuit each for receiving a slave control signal from said master timing generating means.

15. A memory test apparatus according to claim 7 further comprising at least a second slave timing generating means in addition to said slave timing generating means wherein:
 slave control signals from said master timing generating means are inputted to said slave timing generating means and said at least a second slave timing generating means.

* * * * *